(12) United States Patent
Sinha et al.

(10) Patent No.: US 8,089,195 B2
(45) Date of Patent: Jan. 3, 2012

(54) INTEGRATED ACOUSTIC BANDGAP DEVICES FOR ENERGY CONFINEMENT AND METHODS OF FABRICATING SAME

(75) Inventors: Rajarishi Sinha, Pittsburgh, PA (US); Peter Ledel Gammel, Millburn, NJ (US); Marco Mastrapasqua, Annandale, NJ (US); Hugo Safar, Westfield, NJ (US)

(73) Assignee: Resonance Semiconductor Corporation, Pittsburgh, PA (US)

( * ) Notice: Subject to any disclaimer, the term of this patent is extended or adjusted under 35 U.S.C. 154(b) by 256 days.

(21) Appl. No.: 12/002,524

(22) Filed: Dec. 17, 2007

(65) Prior Publication Data
US 2009/0152983 A1 Jun. 18, 2009

(51) Int. Cl.
*H03H 9/17* (2006.01)
(52) U.S. Cl. ......... 310/311; 310/320; 310/335; 310/346
(58) Field of Classification Search .................. 310/311, 310/346, 335, 320
See application file for complete search history.

(56) References Cited

U.S. PATENT DOCUMENTS

| | | | | |
|---|---|---|---|---|
| 5,872,493 A * | 2/1999 | Ella | .............. | 333/191 |
| 6,081,171 A * | 6/2000 | Ella | .............. | 333/189 |
| 6,087,198 A * | 7/2000 | Panasik | .............. | 438/51 |
| 6,762,471 B2* | 7/2004 | Kim | .............. | 257/414 |
| 2001/0040490 A1* | 11/2001 | Tanaka | .............. | 333/204 |
| 2003/0155986 A1* | 8/2003 | Motz | .............. | 331/176 |
| 2003/0227357 A1* | 12/2003 | Metzger et al. | .............. | 333/189 |
| 2004/0069948 A1* | 4/2004 | Feisst et al. | .............. | 250/343 |
| 2004/0088842 A1* | 5/2004 | Maruyama et al. | .............. | 29/25.35 |
| 2005/0110598 A1* | 5/2005 | Larson | .............. | 333/191 |
| 2006/0145785 A1* | 7/2006 | Ishii et al. | .............. | 333/187 |
| 2006/0202779 A1* | 9/2006 | Fazzio et al. | .............. | 333/187 |
| 2006/0278983 A1* | 12/2006 | Ito et al. | .............. | 257/737 |

OTHER PUBLICATIONS

International Search Report, PCT/US2008/013921, dated Apr. 20, 2009.
Partridge et al., "MEMS Resonators: Getting the Packaging Right", 4 pages. (Jan. 2009).
www.ieee-uffc.org/freqcontrol/quartz/vig/vigaccel.htm Retrieved from Internet Sep. 20, 2007.
Tanner, et al., "MEMS reliability in shock environments", IEEE International Reliability Physics Symposium in San Jose, CA, Apr. 10-13, 2000, pp. 129-138.
Vectron: Product Data Sheet, V-Type Voltage Controlled Crystall Oscillator (VCXO), 1-8, Revised Jul. 26, 2000.
Silver, Oscillator Resonator Design Tutorial, 1-20 (2003).
www.en.wikipedia.org/wiki/Crystal_oscillator Retrieved from Internet Oct. 1, 2007.

* cited by examiner

*Primary Examiner* — Walter Benson
*Assistant Examiner* — Bryan Gordon
(74) *Attorney, Agent, or Firm* — Lerner, David, Littenberg, Krumholz & Mentlik, LLP

(57) ABSTRACT

The present invention is directed to monolithic integrated circuits incorporating an oscillator element that is particularly suited for use in timing applications. The oscillator element includes a resonator element having a piezoelectric material disposed between a pair of electrodes. The oscillator element also includes an acoustic confinement structure that may be disposed on either side of the resonator element. The acoustic confinement element includes alternating sets of low and high acoustic impedance materials. A temperature compensation layer may be disposed between the piezoelectric material and at least one of the electrodes. The oscillator element is monolithically integrated with an integrated circuit element through an interconnection. The oscillator element and the integrated circuit element may be fabricated sequentially or concurrently.

16 Claims, 10 Drawing Sheets

10

12  14  12  14  12  14  12  14  12

20

30

32  14  12  14  32  14  12  14  32

40

50

60

100

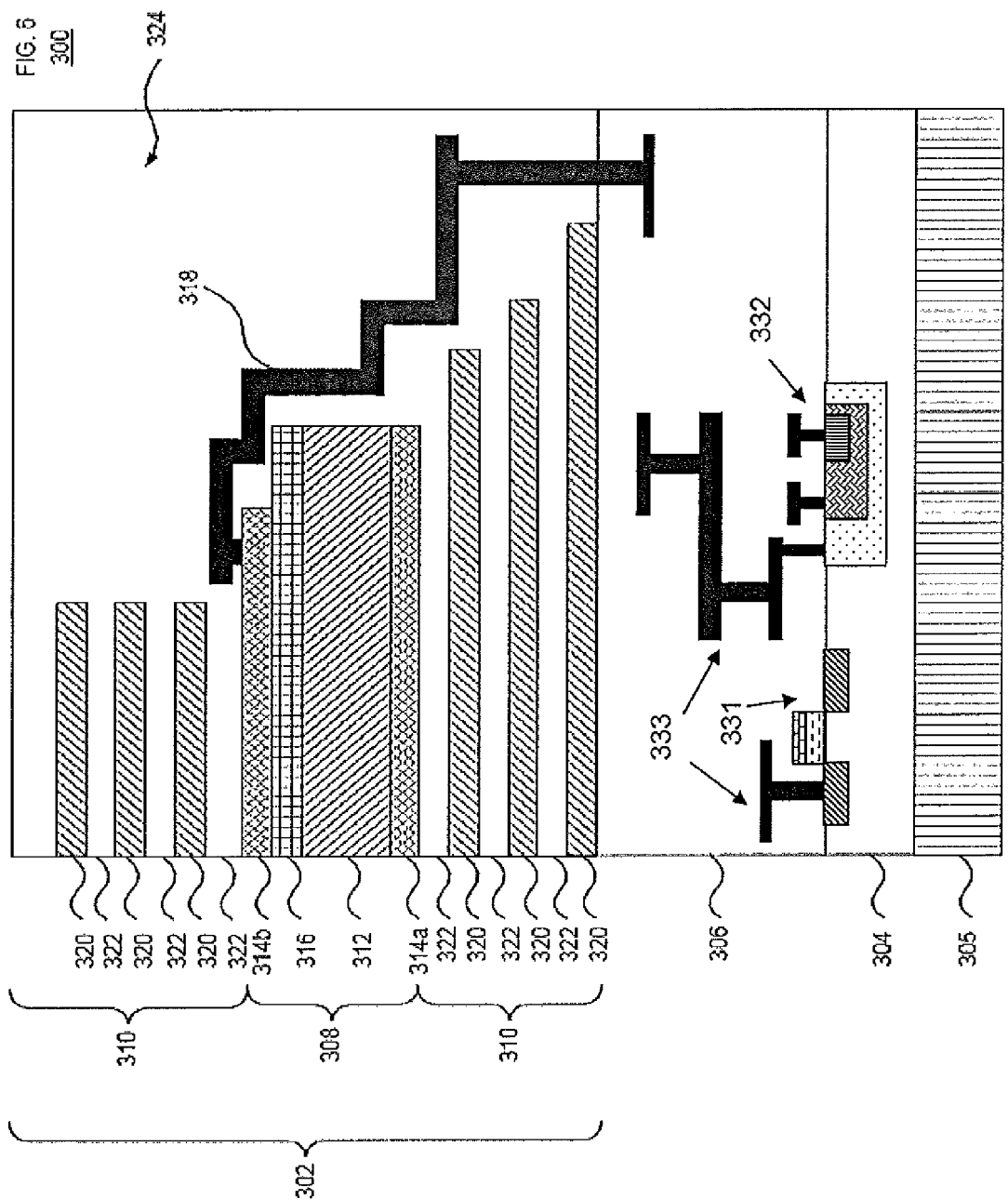

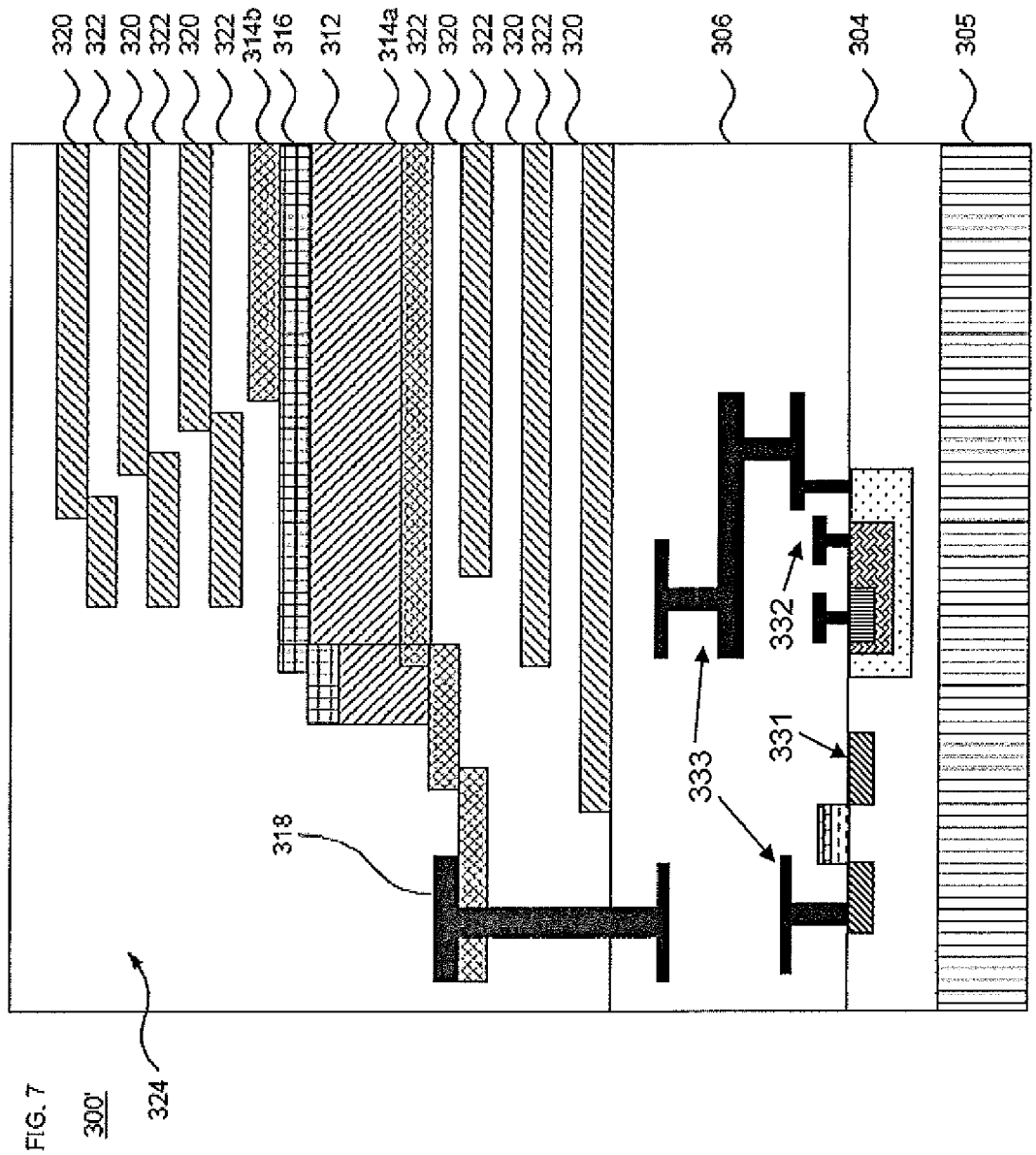

INTEGRATED ACOUSTIC BANDGAP DEVICES FOR ENERGY CONFINEMENT AND METHODS OF FABRICATING SAME

BACKGROUND OF THE INVENTION

The present invention provides monolithic integrated circuits that are particularly adapted for use in timing applications, as well as methods for designing and fabricating same.

Conventional electronic appliances include a timing unit to provide a timing base that controls the internal functioning of the appliance as well as communications with other appliances or devices. Such timing units often comprise a resonator and a driving circuit. In many cases the resonator and circuit are fabricated using different technologies, and thus need wiring or other manner of interconnection in order to function together.

Typically, the resonator is a piezoelectric device that vibrates in free space. The most common resonator is a quartz crystal oscillator that when driven at one of its mechanical resonant frequencies has either a minimum or maximum in its electrical impedance, which is used by the driving circuit to lock itself at this frequency value. Finally, the circuit outputs a signal, for example a sine wave of a well determined and stable frequency that is used by the appliance as a time base.

Another typically used type of resonator is a "MEMS" resonator. MEMS stands for micro-electro-mechanical system. MEMS devices integrate mechanical and electronic elements on a common substrate through microfabrication technology.

For such devices, the requirement of free space vibration implies that the devices need to be carefully packaged. Otherwise they will not work as intended. For instance, quartz crystal oscillators are often packaged in hermetically sealed ceramic packages that allow motion of the quartz part. Motion in this case is driven and recorded by means of electrical connections that join electrodes on the quartz resonator with leads inside the package that in turn are connected though the walls of the ceramic package to external leads or pads. MEMS oscillators may also be placed in hermetically sealed packages. However, unlike quartz crystal oscillators, since MEMS devices are often fabricated on silicon wafers, the hermetic cavity is commonly produced on this wafer rather than on the package.

Such oscillator packaging technology requires the creation of a cavity with very well controlled conditions and is commonly filled with inert gases or a vacuum. The creation of such cavities often requires delicate and expensive assembly processes. Further, cavities pose additional challenge for making the necessary electrical connection to the oscillator devices.

Unfortunately, by their fragile nature the aforementioned free space devices are sensitive to vibration that degrades their performance or shock that can destroy them. Such free space devices are subject to a force when experiencing acceleration. This force increases as the magnitude of acceleration increases. It is possible for the force to eventually reach a level sufficient to perturb the natural motion of the oscillator and even break the delicate component.

It is also important to note that, typically, the acceleration and resulting force experienced by resonator devices is not steady, but rather changes over time. For example, in the case of a rocket launch, devices aboard the rocket experience acceleration that initially grows rapidly, reaches a maximum, and eventually returns to nearly zero as the rocket is in flight. Another example is in the case of devices located in a moving vehicle where vibrations in the vehicle translate to rapidly changing accelerations. The frequency spectrum of many common vibrations is in the range of 10 to 100 kHz. This range can be close, and often includes, the range at which common oscillators work. The fact that such devices are free to move makes them very sensitive to the aforementioned effects.

Thus, it is desirable to develop resonating devices which do not rely on free space and which can be fabricated in an integrated manner with associated circuitry such as a driving circuit. It is also desirable to optimize such resonating devices for timing applications.

SUMMARY OF THE INVENTION

In accordance with aspects of the present invention, monolithic devices are provided which include a resonator element that can vibrate, within a certain frequency range, inside an engineered solid. By removing the need for free space vibration in a hermetic enclosure, devices embodying the present invention are effectively immune to shock, vibration and perturbation of the conditions at the surface of the devices. As explained in detail below, design and fabrication of circuit elements with such resonator elements may be done using the same technology as is used for fabricating the driving circuit, thus providing for efficient fabrication.

In one embodiment the integrated circuit device has an oscillator element that provides a monolithic timing solution. The oscillator element has a resonator element with at least a first bottom electrode and second top electrode and a piezoelectric material interposed between. The resonator element is embedded in an acoustic confinement structure. The integrated circuit component is typically a semiconductor substrate with a plurality of semiconductor device elements formed thereon and at least one metal interconnect layer formed over the plurality of semiconductor elements. The oscillator element is monolithically integrated with the integrated circuit element through at least one metal via electrically interconnecting one of the first or second electrodes with at least one metal interconnect layer.

In a further embodiment the resonator element has a temperature compensation layer. In yet a further embodiment the temperature compensation layer is sandwiched between the piezoelectric layer and the top electrode of the resonator element.

In yet another embodiment, the circuit element of the integrated circuit device is a filter element. The filter element has a resonator element that is embedded in an acoustic confinement structure. In yet another embodiment, the integrated circuit device has both an oscillator element and a filter element.

As further described in the embodiments, the acoustic confinement structure is a periodic structure with a plurality of layers. In these embodiments, the structure has at least two layers of high acoustic impedance alternating with at least two layers having a low acoustic impedance. In further embodiments the periodic structure has a first period having a first layer of high acoustic impedance material and a first layer of low acoustic impedance material. The first period is under the bottom electrode. A second period has at least two layers of the periodic structure one of which is a second layer of high acoustic impedance material and the other of which is a second layer of low acoustic impedance material. The first period is disposed between the bottom electrode and the integrated circuit component. The second period is disposed on the top electrode.

Examples of suitable low acoustic impedance materials are silicon (Si), polysilicon, silicon dioxide (SiO2), silicon oxy-carbide ("SiO$_x$C$_y$"), aluminum (Al) and, polymers and polymethylmethacrylate ("PMM"). Examples of high acoustic impedance material include gold (Au), molybdenum (Mo) tungsten (W), iridium (Ir), platinum (Pt), tantalum pentoxide ("TaO5") and AlN. In one embodiment the first layer of low acoustic impedance material is interposed between the bottom electrode and the first layer of high acoustic impedance and the second layer of low acoustic impedance material is interposed between the top electrode and the second layer of high acoustic impedance material.

In a preferred embodiment, the thickness of the high acoustic impedance material layer is about ten percent less than a quarter wavelength thickness.

BRIEF DESCRIPTION OF THE DRAWINGS

The foregoing and other objects and advantages of the invention will be appreciated more fully from the following further description thereof, with reference to the accompanying drawings, wherein:

FIG. 6 illustrates an interconnect structure for a monolithic bandgap device in accordance with aspects of the present invention.

FIG. 7 illustrates an alternative interconnect structure for a monolithic bandgap device in accordance with aspects of the present invention.

DETAILED DESCRIPTION

The invention is described in terms of several embodiments. These embodiments are described in terms of an oscillator element that contains a resonant structure referred to as a resonant element.

As explained above, quartz crystal and MEMS oscillators may be unsuitable in various applications due to their fragile structures. In accordance with certain aspects of the present invention, such deficiencies may be overcome by employing monolithic integrated circuits configured for use in timing and related applications. In particular, materials are employed so that vibrations of a certain frequency or range of frequencies cannot propagate across them. Such materials can be said to have a band-gap at a given frequency or frequencies.

Figure 1A:
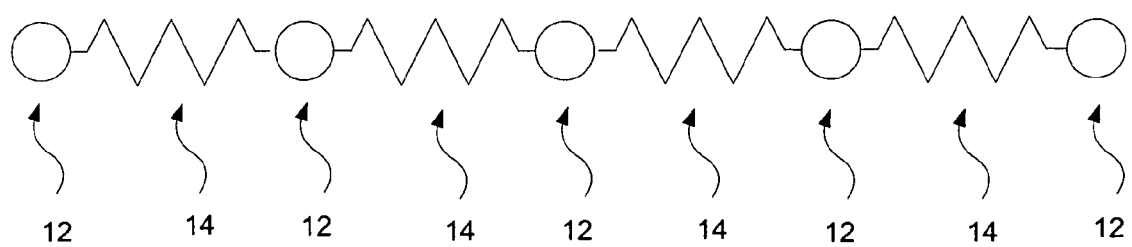
FIGS. 1A-B illustrate an exemplary vibratory system in accordance with aspects of the present invention.

In order to understand how materials and devices of the present invention function, it is useful to consider a number of idealized cases. First, the exemplary structure 10 of FIG. 1A presents a linear chain of particles 12 of the same mass that are interconnected by identical springs 14. This is a well-defined problem in physics, and it is known that an acoustic wave of any frequency f has an associated wave vector k according to the following equation:

$$k = 2*\pi/\lambda. \quad \text{(Eq. 1)}$$

Figure 1B:
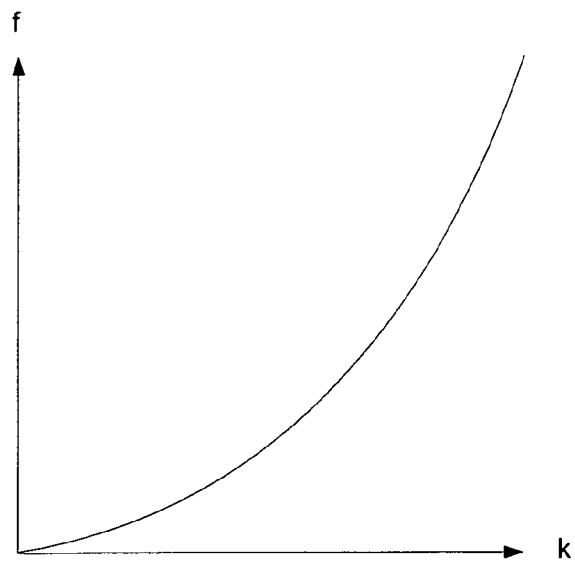

The wave vector k is determined by the wavelength $\lambda$. The relationship between frequency and the wave vector is illustrated in the plot 20 of FIG. 1B.

Figure 2A:
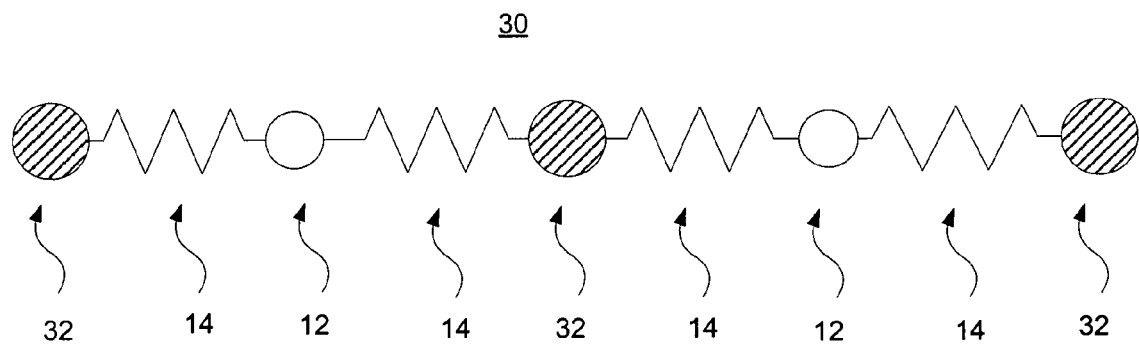
FIGS. 2A-B illustrate an exemplary diatomic vibratory system in accordance with aspects of the present invention.
Figure 2B:
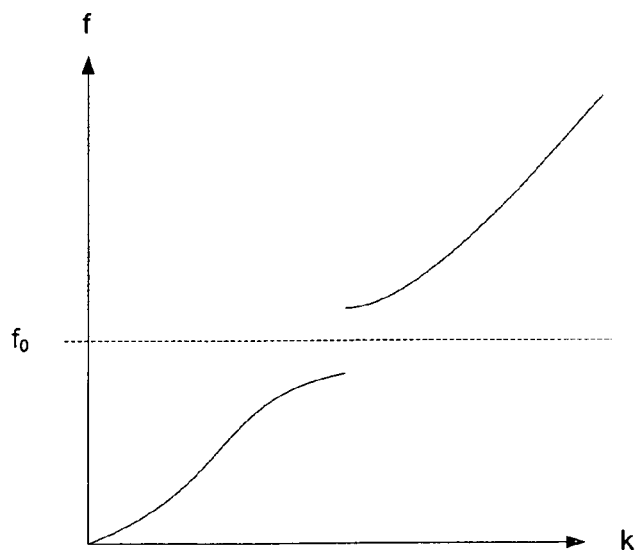

In a more complicated situation presented in the structure 30 shown in FIG. 2A, some of the particles 12 may be replaced by other particles 32 having a different mass. The result is a diatomic chain. In this situation, the solution indicates that there is a certain frequency range about a given frequency, $f_0$, for which waves do not propagate along the structure. This frequency region is termed the "bandgap" and the frequency $f_0$ is defined by the masses of each particle 12 and 32 and the strength of the springs joining the particles. This is shown in the plot 40 of FIG. 2B.

Figure 3A:
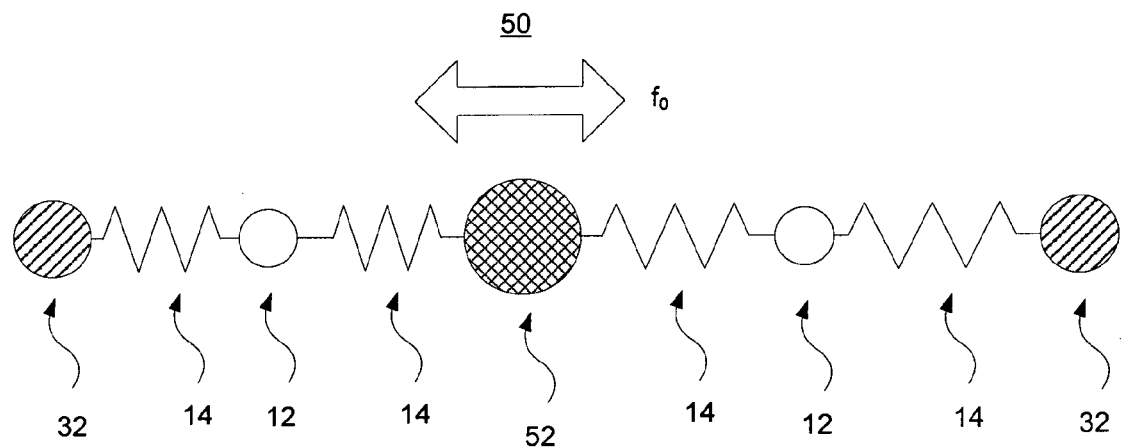
FIGS. 3A-B illustrate an exemplary diatomic vibratory system having an impurity in accordance with aspects of the present invention.
Figure 3B:
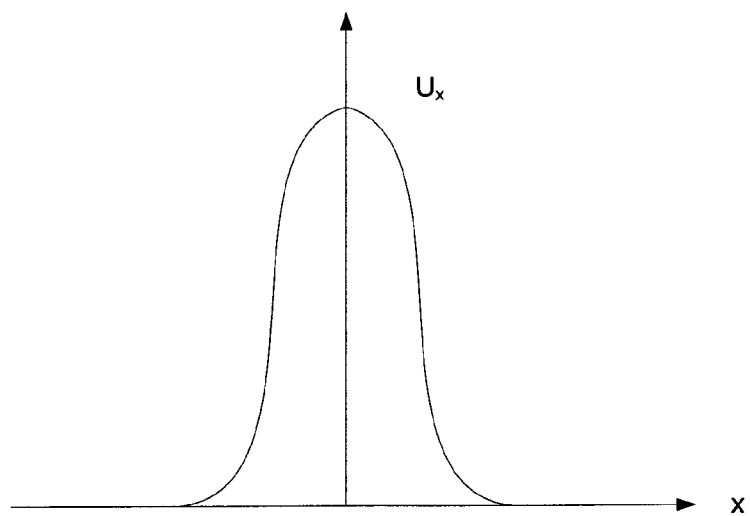

An even more complicated situation occurs when an impurity is placed into a diatomic chain. FIG. 3A illustrates a structure 50 which includes an impurity or particle 52 in a chain having the particles 12 and the particles 32 connected by the springs 14. As shown in the plot 60 of FIG. 3B, when the impurity is driven by a force at frequency $f_0$, the amplitude of motion $U_x$ decays sharply along the chain, because this frequency is not an allowed solution for the chain motion.

Given this understanding, it is possible to address the problem of packaging a resonator element so that it may move at certain frequencies while being very resistant to shock and vibrations. For instance, in accordance with an aspect of the invention, the aforementioned particles are instantiated by layers of specially selected materials while a piezoelectric film acts as the "impurity" 52 of FIG. 3A.

Figure 4:
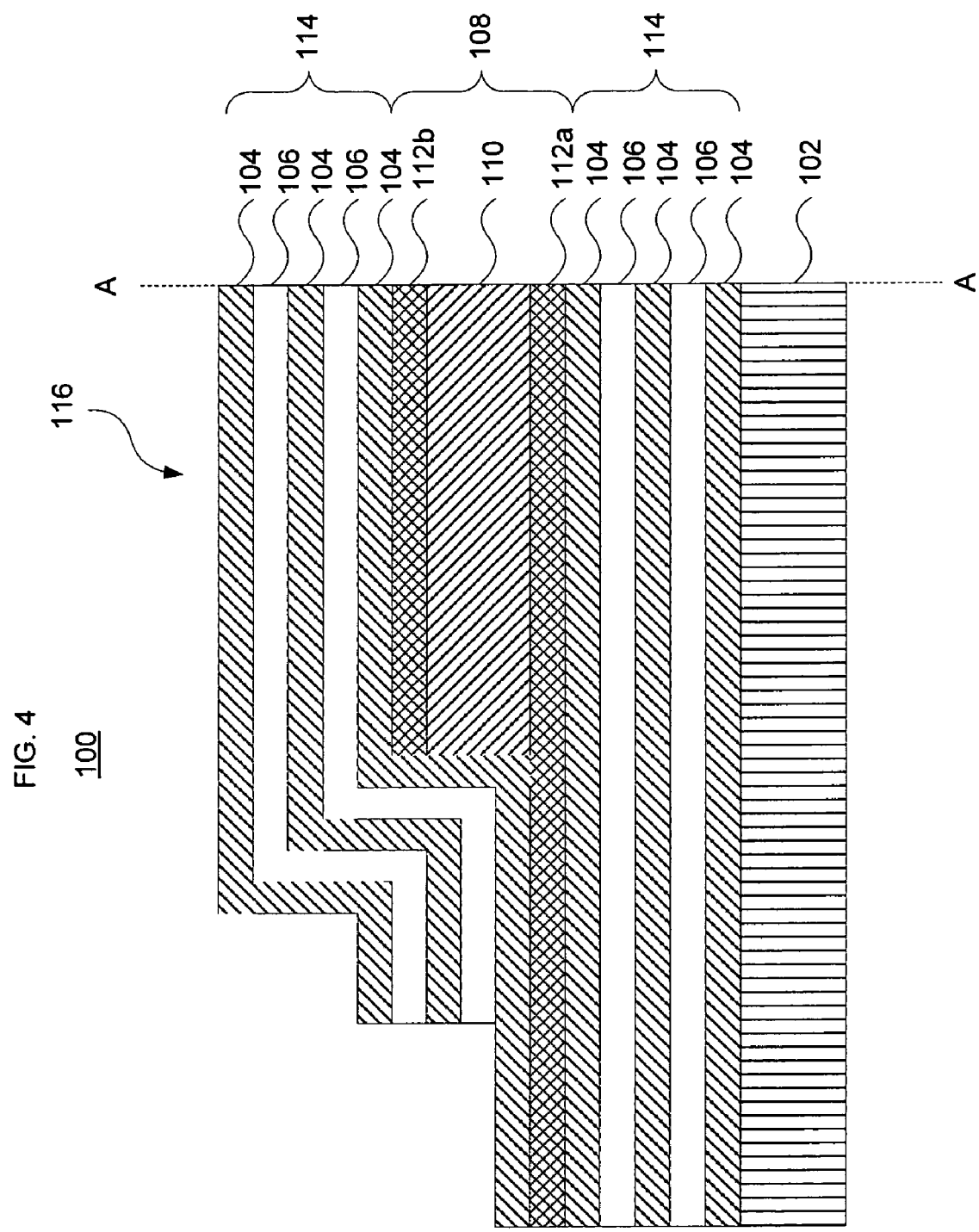
FIG. 4 is an exemplary piezoelectric structure in accordance with aspects of the present invention.

FIG. 4 illustrates a cutaway view of an oscillator element 100 in accordance with a preferred embodiment of the present invention. The oscillator element 100 is preferably disposed on a substrate 102. As shown, the oscillator element 100 includes a number of material layers that are disposed on the substrate 102. The layers include a number of first layers 104 and a number of second layers 106. The oscillator element 100 also includes a resonator element 108 which preferably includes a piezoelectric material 110 interposed between a bottom electrode 112a and a top electrode 112b.

The layers 104 and 106 form an acoustic confinement structure 114. In a preferred arrangement, the first and second layers 104 and 106 are disposed in an alternating arrangement below and above the resonator element 108. However, the number of layers and their composition are largely a matter of design choice. For example, the embodiment illustrated in FIG. 6 has two pairs of layers (104 and 106) plus one additional layer 104. The balance struck in this embodiment is between protection of the resonator (which favors more layers) and manufacturing simplicity (which favors fewer layers). Furthermore, while the illustrated structure has alternating first (104) and second (106) layers, precise correspondence between the number of first and second layers is not required. For example, in FIG. 4 there are illustrated two pairs of first and second layers (102, 104) and one additional second layer (104). Furthermore, there is no requirement that the individual first layer 102 or the individual second layer 104 be the same material as long as the materials have the desired high or low acoustic impedance. Furthermore, the oscillator element 100 is desirably symmetric about the line A-A of FIG. 4, although it is not required.

The resonator element 108 is operable to vibrate within the encapsulating acoustic confinement structure 114. The piezoelectric material 110, such as a piezoelectric film, can be vibrated by applying an alternating electric field to the electrodes 112a and 112b. The vibration, for instance with respect to amplitude and frequency, functions as an ultrasonic wave. The acoustic confinement structure 114 prevents the ultrasonic wave from propagating away from the piezoelectric material 110. The overall structure of the oscillator element 100 creates an acoustic band gap structure.

By keeping acoustic energy away from exterior surfaces of the oscillator element 100, such as surface 116, the performance of the resonator element 108 is protected from the external environment. In addition, the monolithic structure of the oscillator element 100 results in a self packaged device that is effectively insensitive to shock and vibration. This, in turn, makes any subsequent assembly and packaging of systems incorporating the oscillator element 100 much easier.

When fabricating oscillator elements 100 having the general structure described above, it is important to select the thickness and material(s) of each film or layer carefully to achieve desired results. For instance, the thickness of the piezoelectric material 110 and the electrodes 112a and 112b should be selected so that the resonator element 108 has a resonant frequency at the desired frequency of oscillation. The relationship between frequency and thickness is determined by parameters including density and speed of sound of each material layer.

In accordance with an example where a 1.75 GHz resonator is desired, the electrodes 112a and 112b may each comprise a layer of about 0.3 µm thick molybdenum ("Mo"), and the piezoelectric material 110 may comprise a layer of about 1.4 µm thick aluminum-nitride ("AlN"). This determination was made by finite element analysis using known techniques.

With regard to the acoustic confinement structure 114, it can be seen in FIG. 4 that the structure may be split into a pair of acoustic confinement portions that sandwich about or otherwise encapsulate the resonator element 108. The first and second layers 104 and 106 of the acoustic confinement structure 114 desirably alternate in both portions of the structure. One of the layers 104 or 106 preferably has a low density ("D") and a low speed of sound ("Vs"), while the other one of the layers 106 or 104 preferably has a high density D and a high speed of sound Vs. The acoustic impedance of a given layer is determined according to the following equation:

$$\text{acoustic impedance} = D * Vs \quad \text{(Eq. 2)}$$

It has been determined that pairing one layer of material that has a very high acoustic impedance with another layer that has a very low acoustic impedance results in enhanced confinement of acoustic energy, and thus a more effective oscillator element 100. By way of example only, tungsten ("W") has a high density and a high speed of sound, while silicon dioxide ("SiO$_2$") has a low density and a low speed of sound. Alternating layers of W with layers of SiO$_2$ provides excellent acoustic confinement.

The thickness and material of the high and low acoustic impedance layers are preferably chosen so that the layers have a peak reflectivity at the desired oscillation frequency ($f_0$) of the resonator element 108.

For the 1.75 GHz resonator example above, finite element analysis can be used to identify suitable thickness for the confinement layers. According to such analysis, layers of W about 0.78 µm thick and layers of SiO$_2$ about 0.85 µm thick are suitable.

While certain materials have been identified in the examples above, the invention is not limited to those materials. Various materials and combinations of materials can be employed for the piezoelectric material 110, the electrodes 112a and 112b, and the layers of the acoustic confinement structure 114.

By way of example only, suitable materials for the piezoelectric layer 110 include the aforementioned AlN as well as zinc oxide ("ZnO"). Voltage activated materials such as strontium titanate ("STO") or barium strontium titanate ("BST") may also be employed. Such voltage activated materials have a piezoelectric strength that depends on a static voltage that can be applied between the electrodes 112a and 112b in addition to the alternating voltage. Although piezoelectric layer 110 is illustrated as a single layer, other embodiments contemplate a piezoelectric layer that has a plurality of individual piezoelectric layers.

While different materials may be employed for the electrodes 112a and 112b, it is desirable to select a combination of good electrical conduction and low acoustic loss to achieve better resonator performance. Such materials include Mo as well as W, aluminum ("Al"), platinum ("Pt"), and/or iridium ("Ir"). Non metal conductive materials (e.g. doped amorphous silicon) are also contemplated as suitable.

As explained above, the acoustic confinement structure 114 desirably includes a series of alternating layers 104 and 106 disposed on both sides or otherwise enclosing the resonator element 108. Preferable low acoustic impedance materials include SiO$_2$, silicon oxy-carbide ("SiO$_x$C$_y$,") Si, polysilicon, organic materials such as polymethyl methacrylate (PMM), metals such as Al and polymers. Suitable high acoustic impedance materials include, by way of example only, W, Mo, Ir, Pt, tantalum pentoxide ("TaO$_5$"), gold ("Au"), doped amorphous silicon, and AlN. In embodiments where SiO$_x$C$_y$ is the low acoustic impedance material, SiO$_2$ is a suitable high acoustic impedance material. Thus, when choosing pairs of high and low acoustic impedance materials, it can be seen that the exemplary materials identified above provide a wide variety of combinations. While any combination among such high and low impedance materials may be employed, some desired combinations include W and SiO$_2$, Ir and SiO$_2$, W and SiOH, as well as Ir and SiO$_x$C$_y$.

The thickness of each layer should be selected for operation at the target frequency. The thicknesses identified above in the various examples are merely illustrative. It is not required that the thickness of a given layer be exact. For instance, it has been determined that layers in the acoustic confinement structure 114 may vary by approximately 10% without substantial degradation in performance. And layers in the resonator element 108 may vary by up to about 5% or more preferably up to about 3% while achieving satisfactory performance.

The configuration of the oscillator element 100 makes it well suited for integration with other devices and/or components in an integrated circuit. In an example, an integrated circuit may be fabricated on a substrate and the oscillator element may be electrically coupled to the integrated circuit via a metal interconnection layer. For instance, the resonator of the oscillator element may be electrically coupled to a driving circuit using one or more via connections, resulting in a monolithic oscillator solution. Alternatively, the resonator could be fabricated with exposed pads. In this case, the resonator could be coupled to external circuitry using wire bonding or solder bumps.

The above-identified oscillator element 100 may be used in timing applications as well as filter applications. However, in accordance with preferred aspects of the invention, the oscillator element is configured to optimize performance for a clock used in timing applications. Such optimization results in selecting different materials and thicknesses of those materials than one would select for a filter structure.

It is important to understand that regardless of its use, the electrical impedance of a single resonator has two main frequencies. One is called the series resonance frequency ("$f_s$") or "zero" at which the electrical impedance reaches a minimum. The other is called the parallel resonance ("$f_p$") or "pole" at which the electrical impedance reaches a maximum. Either one of these resonances may be used in an oscillator circuit.

Resonators used for clocks are desirably operated along a very narrow range around one of the frequencies $f_s$ or $f_p$. Most preferably, the range is less than 1% about the frequency. In contrast, filter devices typically include several interconnected resonators, each of which may have a different set of series and parallel frequencies. In this case, a filter device is expected to perform along a range of frequencies below the lowest $f_s$ and above the highest $f_p$ among the resonators in the filter. This may be a wide range of frequencies about a mean frequency and typically with a bandwidth on the order of 10% to 20%.

Not only do the operating ranges differ substantially between clocks and filters, but the impact of quality factor ("Qs") of the resonator is also different. Qs is a measure of how sharp the resonance is. The designs for resonators in clock applications seek to maximize Qs. This enables the clock to reach a stable time base, which is measured as very low phase noise in the output of the device. In contrast, bandwidth is a major concern for filter designers and Qs is less critical. Thus, conventional designs for filter resonators often achieve lower Qs in order to obtain a greater bandwidth.

The very different goals for clocking applications and filter applications can result in surprisingly different choices in materials and thickness when preparing the overall design and when seeking to optimize the design.

As the disclosed device is particularly configured for clocking applications, it is very important to focus on the resonator element. For instance, in a case of a resonator element used in a clocking circuit at its series resonance frequency, it is desirable to maximize Qs while minimizing energy loss at the electrode. Mathematically, this may be expressed as:

$$1/Q_s = 1/Q^E_{(electrical)} + 1/Q^E_{(acoustic)} + N \quad \text{(Eq. 3)}$$

where $1/Q^E_{(electrical)}$ and $1/Q^E_{(acoustic)}$ represent the electrical and acoustic energy losses at the electrode, respectively, and the term N represents non-electrode related terms. The two Q terms may be expressed as:

$$Q^E_{(electrical)} = A*t/\rho \quad \text{(Eq. 4)}$$

$$Q^E_{(acoustic)} = B/10^{(\alpha*t)} \quad \text{(Eq. 5)}$$

Here, t represents the thickness of the electrode material, $\rho$ is the electrical resistivity of the electrode material, and $\alpha$ is the acoustic loss factor of the electrode material. Factors A and B depend on electrode lateral dimensions, where the electrode connects to the circuit, and other parameters which will be selected to provide a device with the desired $Q_s$ for the particular application. It is important to note that as the electrode thickness increases, $Q^E_{(electrical)}$ increases while $Q^E_{(acoustic)}$ decreases. Therefore, the total Qs reaches a maximum at a determinable electrode thickness. Using testing and analysis, it has been determined that a maximized Qs occurs within the range of 0.4 µm-0.5 µm for an electrode formed of Mo.

In some device applications (e.g. filters), it is known to provide layers of acoustic impedance material with a thickness equal to one quarter wavelength of the acoustic material in question, or, in other words, equal to $0.25(V_s/f_0)$ with Vs being the speed of sound of the material in question and $f_0$ the center of the frequency band over which the filter is designed to operate.

In contrast with these other device applications, according to an aspect of the present invention, the acoustic confinement structure of the oscillator element is designed to maximize Qs. It has been determined that the low acoustic impedance material layers should be made thicker than the high impedance material layers to achieve this objective. In particular, it is preferred that a given low acoustic impedance material layer should be on the order of 10% thinner than a quarter of the acoustic wavelength of the respective layer. It is preferred that a given high acoustic impedance material layer should be thinner than the layer of low acoustic impedance material.

Figure 5:
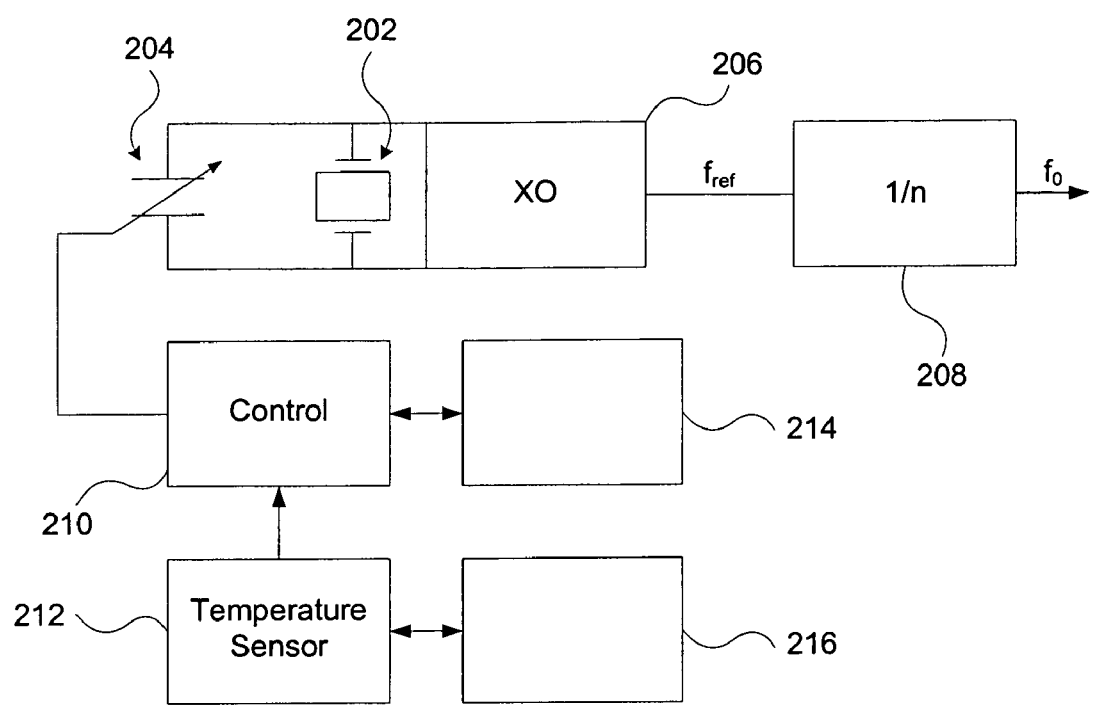
FIG. 5 is a schematic illustrating an exemplary oscillator circuit in accordance with aspects of the present invention.

There are any number of different ways to implement an oscillator and its attendant circuitry. FIG. 5 is a block diagram representing a preferred oscillator circuit 200. The circuit 200 includes an oscillator element 202 which may be fabricated in accordance with any of the embodiments herein, including any variations in materials, thicknesses and layering for the resonator element and attendant acoustic confinement structure. The oscillator element 202 is preferably coupled to a variable capacitor 204 as well as to an oscillator driving circuit ("XO") 206. The driving circuit 206 is linked to a divider 208. A control circuit 210 is operable to drive the variable capacitor 204.

A temperature sensor 212 may optionally be coupled to the control circuit 210 so that the oscillator circuit 200 may handle temperature variations. The temperature sensor 212 may have one or more sensing elements disposed in or around the oscillator element 202 and/or other components of the oscillator circuit 200. The control circuit 210 and the temperature sensor 212 may each have a memory, such as respective non-volatile memories 214 and 216, associated therewith.

As shown in the figure, the oscillator driving circuit 206 outputs a reference frequency $f_{ref}$ which is fed to the divider 208. In turn, the divider 208 is operable to emit a desired frequency $f_0$. Preferably, the oscillator driving circuit 206 includes at least one active device such as a transistor that acts as an amplifier.

In operation, when power is first applied to the oscillator circuit 200, random noise or other transient voltage is generated within the active device of the oscillator driving circuit 206 and is amplified. This may be fed back through the oscillator element 202, which is by design a frequency selective device. Thus, only a selected frequency, $f_0$, is again amplified in a closed loop sequence.

Small variations in the variable capacitor 204 may tune the frequency for stable operation. The temperature sensor 212, either alone or in conjunction with the control circuit 210, may use temperature feedback data and/or temperature-related data stored in the memory 216 and/or the memory 214 to correct small temperature variations which would otherwise affect the frequency of oscillation of the components in circuit 200.

The aforementioned configuration is operable to produce a sinusoidal voltage of frequency $f_{ref}$, which is determined by design of the oscillator element 202, including its attendant acoustic confinement structure, as well as the value of the variable capacitor 204. In many cases, a different, and typically lower, frequency output $f_0$ is desired. The divider 208 is operable to convert $f_{ref}$ to $f_0$.

As discussed above, oscillator elements, including the resonator element and the acoustic confinement structure provided in accordance with the present invention, may be fabricated with other components as part of a monolithic device.

There are various ways in which a given oscillator element may be integrated with the other components of the overall device. FIGS. 6 and 7 illustrate two different interconnection approaches, either of which may be employed with any of the embodiments disclosed herein.

Specifically, FIG. 6 presents a cutaway view of an integrated circuit device 300 in which an oscillator element 302 is monolithically integrated with an integrated circuit component 304 through an interconnection layer 306. The integrated circuit component 304 (shown with devices 331 and 332 formed therein) is preferably disposed on a substrate 305. A's in the example shown in FIG. 4, the oscillator element 302 includes a resonator element 308 and an acoustic confinement structure 310. As shown in FIG. 6 the resonator element 308 preferably includes piezoelectric material 312 interposed between a bottom electrode 314a and a top electrode 314b. In the present embodiment, it is preferred to include a temperature compensation layer 316 between the piezoelectric material 312 and the top electrode 314b.

The temperature compensation layer 316 desirably includes $SiO_2$ or a similar material, and is used to make the frequency, e.g. the $f_0$, insensitive to temperature changes. Metals (e.g. Ni—Ti) that contribute to the electrode function are also contemplated as suitable temperature compensation layers. The thickness of the temperature compensation layer is selected based upon factors such as electrode thickness, resonator thickness, etc. For example, a 1.75 GHz resonator with an AlN thickness of 1.250 μm and an electrode thickness of 0.3 μm yields a temperature compensation layer with a thickness of 0.065 μm.

As shown in the figure, the top electrode 314b is coupled to the interconnection layer 306 through trace or lead 318. For trace 318, a primary objective is to reduce interconnect electrical resistance to a minimum. This is in contrast to a primary objective for the electrodes where there is a balance between electric and acoustic losses. Thus, in order to optimize performance, it is desirable for the trace 318 to have a different thickness and material than what is used for the electrodes 314a and 314b. For instance, the metal of trace 318 is preferably thicker than that of the electrodes 314a and 314b. Here, the trace 318 may be formed of Al with a thickness on the order of 1 μm or greater. In a preferred example, the trace thickness is at least twice that of the electrode thickness.

The acoustic confinement structure 310 is preferably disposed on either side of the resonator element 308. Here, alternating layers 320 and 322 are akin to the layers 104 and 106 of FIG. 4. Preferably layers 320 comprise a high acoustic impedance material while layers 322 comprise a low acoustic impedance material. The layers 322 of low acoustic impedance material may be fabricated as part of a region 324 such as a dielectric region that encapsulates the trace 318 and other portions of the oscillator element 302. Thus, the dielectric or other encapsulant provides protection for the integrated circuit device 300. The high and low impedance materials may be of any of the types described herein. There is no requirement that the individual high impedance and low impedance layers in an acoustic confinement structure be made of the same material. For example, an acoustic confinement structure might have $W/SiO_2$ as a first stack of high impedance/low impedance materials and W/Al as a second stack of high impedance/low impedance materials in one structure.

FIG. 7 presents an alternative configuration of the integrated circuit device 300. Specifically, FIG. 7 presents a cutaway view of an integrated circuit device 300' in which the oscillator element 302 is monolithically integrated with the integrated circuit component 304 through the interconnection layer 306. As in the examples shown in FIG. 4 and FIG. 6, the oscillator element 302 includes a resonator element 308 and an acoustic confinement structure 310. As shown in FIG. 6 the resonator element 308 preferably includes piezoelectric material 312 interposed between a bottom electrode 314a and a top electrode 314b. As with the embodiment of FIG. 6, it is preferred to include the temperature compensation layer 316 between the piezoelectric material 312 and the top electrode 314b.

The primary difference between the integrated circuit device 300' and the integrated circuit device 300 is how the device 300' is electrically coupled to the integrated circuit component 304 (shown with devices 331 and 332 formed therein) through the interconnection layer 306. In the present embodiment, trace 318' couples the bottom electrode 314a to the interconnection layer 306. Either trace configuration may be employed depending on how the integrated circuit device 300 is fabricated. This gives the circuit designer flexibility in the configuration and layout of the various components and interconnections, which may be highly beneficial when fabricating the monolithic integrated circuit device.

It should be noted that in an alternative configuration, the temperature compensation layer 316 is disposed between the piezoelectric material 312 and the bottom electrode 314a. Also, while the examples in FIGS. 6 and 7 illustrate that the oscillator element may be fabricated after the attendant circuitry has been disposed on the substrate, similar techniques may be employed to fabricate the oscillator element before or during fabrication of the attendant circuitry.

Monolithic fabrication may be done using known VLSI fabrication technology and equipment. For instance, the oscillator element, integrated circuit component and any necessary interconnections may be formed by masking, depositing, growing, annealing, etching, etc. of various materials on a substrate such as a silicon wafer substrate.

Figure 8A:
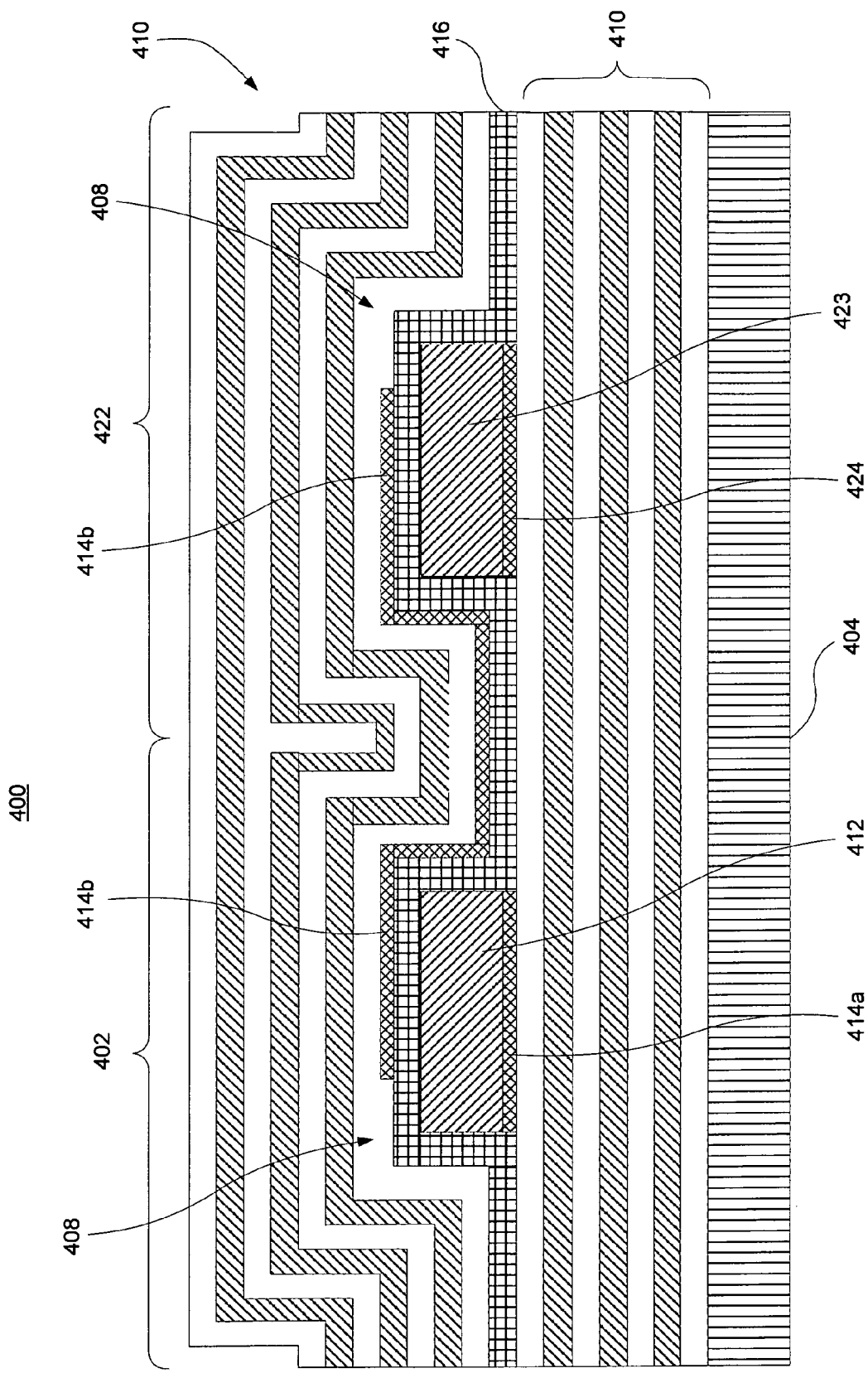
FIGS. 8A and 8B are cross sections of two embodiments of a differentially driven oscillator element according to aspects of the present invention.

In another embodiment, a differential oscillator is provided on a single substrate and monolithically integrated with an integrated circuit device. Referring to FIG. 8A, a cutaway view of an integrated circuit device 400 illustrates first oscillator element 402 and second oscillator element 422 which are monolithically integrated with the integrated circuit component 404 through an interconnection structure (not shown). As in the examples shown in FIG. 4 and FIG. 6, the oscillator elements 402 and 422 include a resonator element 408 and an acoustic confinement structure 410. The resonator element 408 preferably includes piezoelectric material 412 interposed between a bottom electrode 414a and a top electrode 414b. As with the embodiment of FIG. 6, it is preferred to include the temperature compensation layer 416 between the piezoelectric material 412 and the top electrode 414b. The second oscillator element 422 shares the same acoustic confinement structure 410, temperature compensation layer 416, and top electrode 414b. The second oscillator element has its own piezoelectric material 423 interposed between a bottom electrode 424 and a top electrode 414b. The piezoelectric portions 412 and 423 are typically formed by depositing a piezoelectric layer and patterning the layer to form both portions.

Figure 8B:
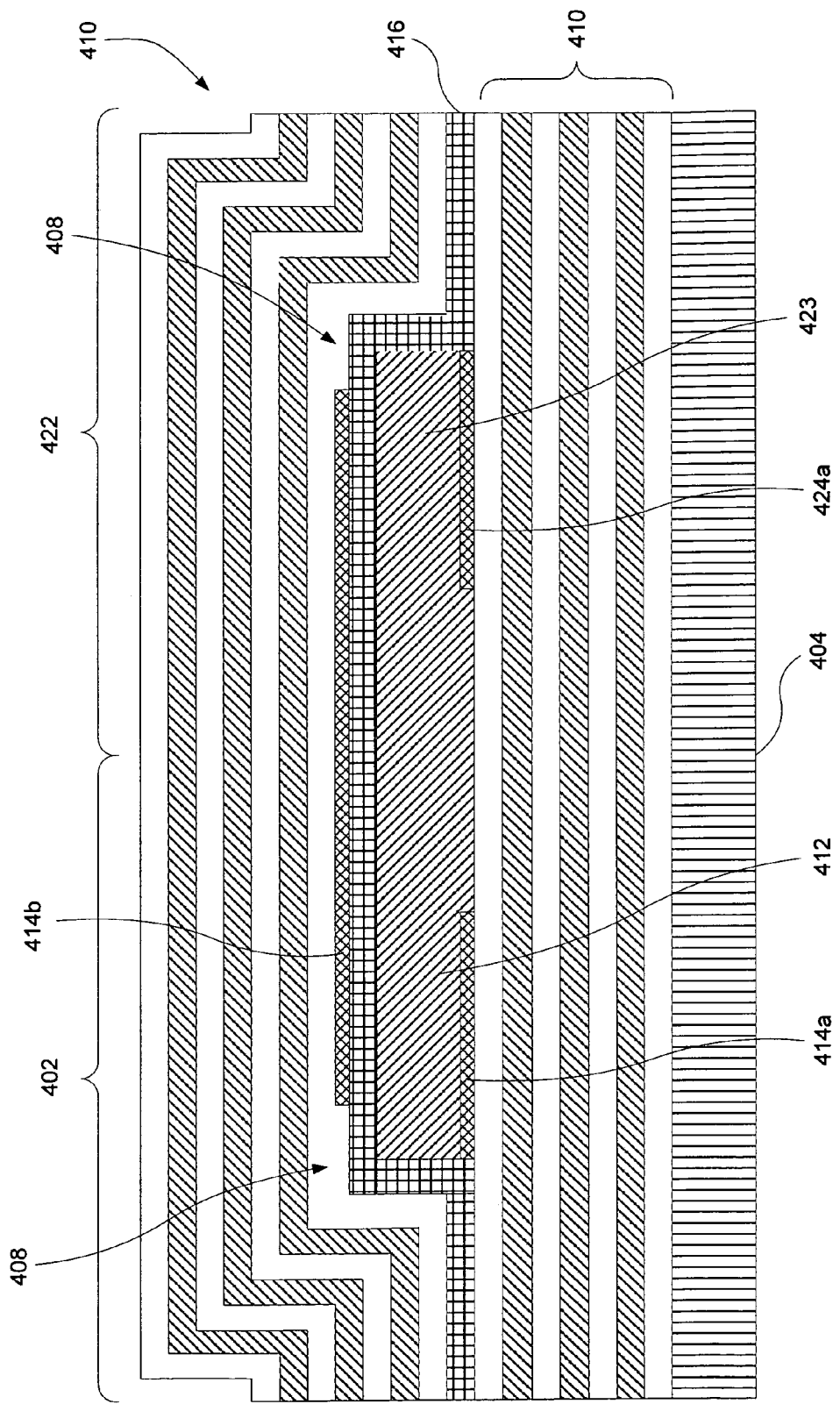

FIG. 8B is an alternate structure in which the first oscillator element 402 and second oscillator element 422 also share the same piezoelectric material 412 but have separate bottom electrodes. That is, first oscillator element 402 has electrodes 414a and 414b and second oscillator element 422 has electrodes 424 and 414b.

Figure 9:
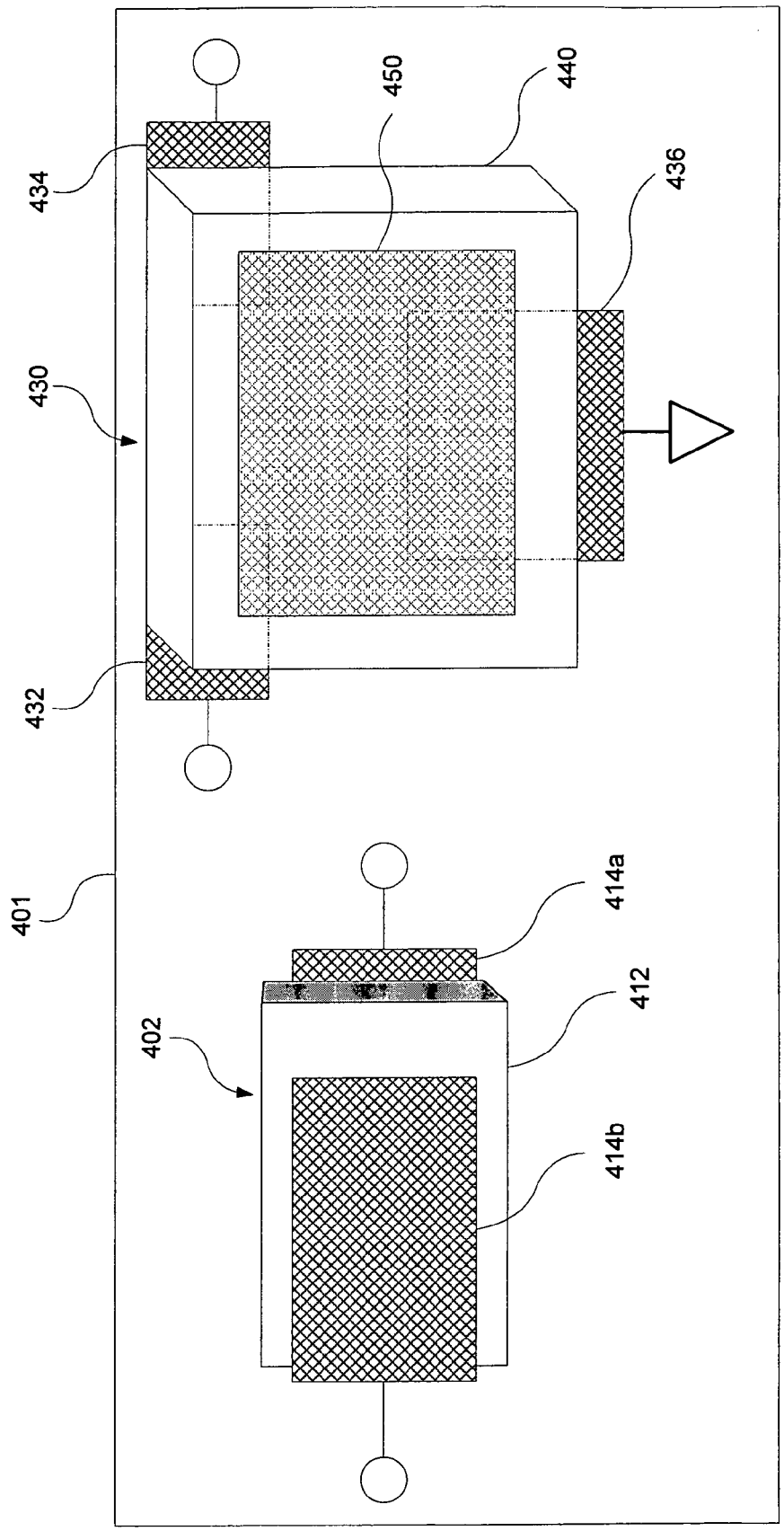
FIG. 9 is a top down view of another embodiment having a filter element and an oscillator element.

FIG. 9 is a top down view of integrated circuit device 400 with the top layers of the acoustic confinement structure removed therefrom. The integrated circuit device has an oscillator element 402 as previously described and a filter element 430. The oscillator element 402 and filter element 430 are supported by an integrated circuit device substrate with a lower portion of the acoustic confinement structure (not shown) formed thereon on which is formed the oscillator element 402 and filter element 430. The surface on which the oscillator element 402 and filter element 430 are formed is shown as 401. The footprint of the oscillator element and the filter element are observed as formed on the same layer, but not connected. It is advantageous from a manufacturing perspective for the devices to share the same acoustic confinement structure.

The oscillator element 408 has the previously described electrodes 414*a* and 414*b* and piezoelectric material 412. The temperature compensation layer for the oscillator element 402 is not illustrated in FIG. 9. The filter element 430 does not have a temperature compensation layer.

The filter element 430 is illustrated as a T-filter by way of example and not by way of limitation. Other filter configurations are well known to one skilled in that art and are contemplated as suitable. Other examples of suitable filter structures include, for example, ladder filters, lattice filters and mechanically coupled filters. The filter element 430 has three patterned electrodes, 432, 434, and 436 over which is formed a continuous piezoelectric layer 440. A single electrode 450 is formed on the piezoelectric layer 440. Electrodes 432 and 434 define the series resonance portion of the filter element 430 and electrode 436 defines the shunt portion of the filter. Electrodes 432 and 434 are connected to a voltage source (not shown) and electrode 436 is connected to ground. Connections to the voltage source is through the common interconnect structure of the integrated circuit device 400, as previously described. Electrode 450 is not electrically interconnected but provides the filter element 430 with a source for capacitance.

As previously noted, it is advantageous if the devices are embedded in the same acoustic confinement structure. From a manufacturing perspective it is also advantageous if the individual components of the resonator elements of both devices are fabricated simultaneously. Specifically, it is advantageous if each of the bottom electrodes, piezoelectric layer and top electrodes of the oscillator element 402 and the filter element 430 are patterned from respective single layers for each component formed on the substrate 400.

While the invention has been disclosed in connection with the preferred embodiments shown and described in detail, it will be understood that the invention is not to be limited to the embodiments disclosed herein, but is to be understood from the following claims, which are to be interpreted as broadly as allowed under the law.

The invention claimed is:

1. An integrated circuit device comprising:
   a circuit element comprising a resonator element having at least a first bottom electrode and second top electrode and a piezoelectric material interposed therebetween and an acoustic confinement structure comprising adjacent layers of low and high acoustic impedance material, wherein the resonator element is embedded in the acoustic confinement structure;
   an integrated circuit component comprising a semiconductor substrate with a plurality of semiconductor device elements formed thereon and at least one metal interconnect layer formed over the plurality of semiconductor elements;
   wherein the circuit element is monolithically integrated with the integrated circuit element through at least one metal via electrically interconnecting one of the first or second electrodes with a selected one of the at least one metal interconnect layers and wherein the at least one metal interconnect layer is formed in a dielectric layer and wherein the low acoustic impedance material is part of the dielectric layer and the via is formed through the dielectric layer to interconnect the electrode with one of the at least one metal interconnect layers.

2. The integrated circuit device of claim 1 wherein the resonator element further comprises a temperature compensation layer.

3. The integrated circuit device of claim 2 wherein the temperature compensation layer is sandwiched between the piezoelectric layer and the top electrode.

4. The integrated circuit device of claim 1 wherein the acoustic confinement structure is a periodic structure with a plurality of layers having at least two layers of high acoustic impedance alternating with at least two layers having a low acoustic impedance.

5. The integrated circuit device of claim 4 wherein at least two layers of the periodic structure are a first period having a first layer of high acoustic impedance material and a first layer of low acoustic impedance material and at least two layers of the periodic structure are a second period having a second layer of high acoustic impedance material and a second layer of low acoustic impedance material, the first period being disposed between the bottom electrode and the integrated circuit component, and the second period being disposed over the top electrode.

6. The integrated circuit device of claim 5 wherein the low acoustic impedance material is selected from the group consisting of silicon (Si), polysilicon, silicon dioxide ($SiO_2$), silicon oxy-carbide ("$SiO_xC_y$"), aluminum (Al), polymers and polymethylmethacrylate ("PMM").

7. The integrated circuit device of claim 5 wherein the high acoustic impedance material is selected from the group consisting of gold (Au), molybdenum (Mo), tungsten (W), iridium (Ir), platinum (Pt), tantalum pentoxide ("$TaO_5$"), silicon dioxide ($SiO_2$), doped amorphous silicon, and AlN.

8. The integrated circuit device of claim 5 wherein the first layer of low acoustic impedance material is interposed between the bottom electrode and the first layer of high acoustic impedance and the second layer of low acoustic impedance material is interposed between the top electrode and the second layer of high acoustic impedance material.

9. The integrated circuit device of claim 4 wherein the thickness of the high acoustic impedance material layer is about ten percent less than a quarter wavelength thickness.

10. The integrated circuit device of claim 1 wherein the bottom electrode is electrically interconnected with the selected one of the at least one metal interconnect layers.

11. The integrated circuit device of claim 1 wherein the at least one metal via electrically couples the top electrode to the selected one of the at least one metal interconnect layers.

12. The integrated circuit device of claim 4, wherein the acoustic confinement structure comprises an encapsulating section which substantially covers the resonator element and the at least one metal via.

13. The integrated circuit device of claim 1 wherein the circuit element is selected from the group consisting of an oscillator element and a filter element.

14. The integrated circuit device of claim 13 further comprising a second circuit element, wherein the first circuit element is an oscillator and the second circuit element is a filter.

15. The integrated circuit device of claim 14 wherein the oscillator and the filter are embedded in a single acoustic confinement structure.

16. The integrated circuit device of claim 15 wherein the resonator element of the oscillator further comprises a temperature compensation layer and wherein the top electrode for the oscillator resonator element is formed in the same metal layer as the top electrode for the filter element.

* * * * *

UNITED STATES PATENT AND TRADEMARK OFFICE
CERTIFICATE OF CORRECTION

PATENT NO. : 8,089,195 B2  
APPLICATION NO. : 12/002524  
DATED : January 3, 2012  
INVENTOR(S) : Rajarishi Sinha et al.

It is certified that error appears in the above-identified patent and that said Letters Patent is hereby corrected as shown below:

Column 9, line 4, after 306, insert --(with interconnects 333)--.  
    Column 10, line 8, after 306, insert --(with interconnects 333)--.

Signed and Sealed this  
Fifth Day of March, 2013

Teresa Stanek Rea  
*Acting Director of the United States Patent and Trademark Office*